United States Patent [19]
Kairouz

[11] Patent Number: 5,812,071
[45] Date of Patent: Sep. 22, 1998

[54] APPARATUS AND METHOD FOR LOSSY COMPRESSION USING DYNAMIC DOMAIN QUANTIZATION

[75] Inventor: Joseph Kairouz, Ottawa, Canada

[73] Assignee: Northern Telecom Limited, Montreal, Canada

[21] Appl. No.: 696,088

[22] Filed: Aug. 13, 1996

[51] Int. Cl.[6] .................................................. H03M 7/00
[52] U.S. Cl. ............................................................. 341/51
[58] Field of Search ............................... 341/51, 106, 55; 364/861, 807

[56] References Cited

U.S. PATENT DOCUMENTS

| | | | |
|---|---|---|---|
| 4,591,928 | 5/1986 | Bloom et al. | 360/13 |
| 5,270,963 | 12/1993 | Allen et al. | 364/861 |

*Primary Examiner*—Brian K. Young
*Attorney, Agent, or Firm*—Foley & Lardner

[57] ABSTRACT

An apparatus and method for reducing the dynamic range of input numbers representing a physical quantity by producing a sample set of sample numbers representing a representative sample of the physical quantity and for each sample number, determining a corresponding nearest mapping weight from a plurality of mapping weights of a mapping function. The corresponding nearest mapping weight is increased or decreased in proportion to the arithmetic difference between the corresponding nearest mapping weight and each sample number in the sample set. Then, each successive input number, is applied to the mapping function to produce a corresponding output number. There is also disclosed a processor readable medium on which is stored a set of instructions operable to direct a processor to perform the method.

51 Claims, 9 Drawing Sheets

| | | |
|---|---|---|
| W(1)= | 0 | RED |
| W(2)= | 90 | ORANGE |
| W(3)= | 150 | YELLOW |
| W(4)= | 155 | GREEN |
| W(5)= | 200 | BLUE |
| W(6)= | 220 | INDIGO |
| W(7)= | 230 | VIOLET |
| W(8)= | 255 | PURPLE |

Fig.8

APPARATUS AND METHOD FOR LOSSY COMPRESSION USING DYNAMIC DOMAIN QUANTIZATION

This invention relates to dynamic range compression using lossy compression techniques particularly for compression of photographic images.

BACKGROUND OF THE INVENTION

The transmission and storage of data representing a physical quantity often involves performing well-known compression techniques to compress the data into a form in which the same information is contained in less data. If loss of some information is acceptable, data transmission rates can be significantly improved by employing lossy compression techniques.

Conventional lossy compression techniques applied to image data normally attempt to determine a correlation between adjacent pixels and use that correlation to define the image. For example, it often takes fewer bits to store the differences between pixels than the pixels themselves. Such correlation however, ignores the ability of the human eye and brain to interpret images. If this ability is recognized, significant improvements to compression can be realized.

SUMMARY OF THE INVENTION

In accordance with one aspect of the invention, there is provided a method of reducing the dynamic range of input numbers representing a physical quantity, the method comprising the steps of:

producing a sample set of sample numbers representing a representative sample of the physical quantity;

for each sample number, determining a corresponding nearest mapping weight from a plurality of mapping weights of a mapping function, and increasing or decreasing the corresponding nearest mapping weight in proportion to the arithmetic difference between the corresponding nearest mapping weight and each sample number;

applying each successive input number, to the mapping function to produce a corresponding output number.

Preferably, the step of applying includes the step of producing a corresponding output number generally equal to the corresponding nearest mapping weight.

Preferably, the step of determining includes finding the arithmetic difference between the each sample number and each mapping weight of the mapping function and selecting as the corresponding nearest mapping weight a mapping weight which is associated with the least arithmetic difference.

Preferably, the step of increasing or decreasing includes decreasing the corresponding nearest mapping weight when the each sample number is less than the corresponding nearest mapping weight and increasing the corresponding nearest mapping weight when the each sample number is greater than the corresponding nearest mapping weight.

Preferably, the step of increasing or decreasing includes the step of producing a weighting adjustment factor by multiplying the arithmetic difference between each sample number and the corresponding nearest mapping weight by an adjustment value.

Preferably, the step of increasing or decreasing includes the step of adding or subtracting the adjustment factor from the corresponding nearest mapping weight.

Preferably, the step of applying each successive input number to the mapping function includes the step of finding the arithmetic difference between each successive input number and each mapping weight of the mapping function and selecting as the corresponding nearest mapping weight a mapping weight which is associated with the least arithmetic difference.

The step of producing may include the step of producing a series of numbers representing the colours of pixels in successive scanlines of a colour image.

The steps of determining and increasing or decreasing may be performed periodically, asynchronously or when the arithmetic difference between successive input numbers exceeds a pre-defined difference value.

In accordance with another aspect of the invention, there is provided a method of compressing a set of numbers representing a graphic image, the set of numbers having an initial dynamic range, the method including the steps of:

producing a reduced set of numbers representing the graphical image, the reduced set of numbers having a lesser dynamic range than the initial dynamic range; and passing the reduced set of numbers through an edge detector to produce an edge representative series of numbers representing changes and locations of changes in the reduced set of numbers.

Preferably, the step of producing a reduced set of numbers representing the graphical image includes the steps of:

for each number in the set of numbers, determining a corresponding nearest mapping weight from a plurality of mapping weights of a mapping function, and increasing or decreasing the corresponding nearest mapping weight in proportion to the arithmetic difference between the corresponding nearest mapping weight and each number; and applying each successive number of the initial set of numbers, to the mapping function to produce corresponding output numbers, the corresponding output numbers acting as the reduced set of numbers representing the graphic image.

In accordance with another aspect of the invention, there is provided a processor-readable storage medium having stored thereon instructions operable to direct a processor to execute the method disclosed above.

In accordance with another aspect of the invention, there is provided a processor-readable storage medium having stored thereon instructions operable to direct a processor to compress an initial set of numbers representing a graphic image, by:

producing a reduced set of numbers representing the graphical image, the reduced set of numbers having a lesser dynamic range than the initial set of numbers; and performing an edge detector function on the reduced set of numbers to produce an edge representative series of numbers representing changes and locations of changes in the reduced set of numbers.

Preferably, the storage medium includes instructions operable to direct the processor to:

for each number in the initial set of numbers, determine a corresponding nearest mapping weight from a plurality of mapping weights of a mapping function, and increase or decrease the corresponding nearest mapping weight in proportion to the arithmetic difference between the corresponding nearest mapping weight and each number; and apply each successive number of the initial set of numbers, to the mapping function to produce corresponding output numbers, the corresponding output numbers acting as the reduced set numbers representing the graphic image.

In accordance with another aspect of the invention, there is provided an apparatus for reducing the dynamic range of input numbers representing a physical quantity. The apparatus includes an input register for successively receiving and storing the input numbers, a plurality of mapping registers for storing mapping weights of a mapping function, a processor in communication with the input memory and the plurality of mapping registers, a processor-readable medium on which is stored instructions operable to direct the processor to:

i) determine the arithmetic differences between the contents of the input register and the mapping registers;

ii) determine a nearest mapping register associated with the least arithmetic difference;

iii) increase or decrease the contents of the nearest mapping register in proportion to the least arithmetic difference;

iv) replace the contents of the input register with successive sample numbers and repeat the above steps for a plurality of sample numbers representative of the physical quantity;

v) perform the mapping function on each of the input numbers of the sample set to produce corresponding output numbers.

In accordance with another aspect of the invention, there is provided an apparatus for compressing an initial set of numbers representing a graphic image, the initial set of numbers having an initial dynamic range. The apparatus includes an input register for receiving and storing a sample number from a sample set of sample numbers representing the graphic image, a plurality of registers for storing mapping weights of a mapping function, a processor in communication with the input memory and the plurality of mapping registers, and a processor-readable medium on which is stored instructions operable to direct the processor to:

i) produce a reduced set of numbers representing the graphical image, by:

a) determining the arithmetic differences between the contents of the input register and the mapping registers;

b) determining a nearest mapping register is associated with the least arithmetic difference;

c) increasing or decreasing the contents of the nearest mapping register in proportion to the least arithmetic difference;

d) replacing the contents of the input register with successive sample numbers and repeating the above steps for a plurality of samples representative of the physical quantity;

e) successively performing the mapping function on each of the input numbers to produce a sequence of corresponding output numbers, the corresponding output numbers acting as the reduced set of numbers; and ii) to produce an edge representative series of numbers representing changes and locations of changes in the reduced set of numbers by:

a) determining the arithmetic differences between successive output numbers and, when a difference is non-zero, producing a number pair including the output number and a number representing the location of the output number in the output number sequence.

Generally, the method and apparatus according to the invention implement a neural network employing a Kohonen architecture. Effectively, the apparatus and method classify different pieces of the image into more general pieces. The Kohonen network learns small blocks of pixels representing the image. The weights of the Kohonen network classify every pixel within block categories to provide the best representation of each pixel with minimal distortion or loss. The result is a set of representative blocks that provide the most statistically accurate representation of the pixels in a piece of the image. The number of possible representative blocks is decided by the user.

After the step of learning has been performed, the image is fed into the Kohonen network which produces outputs identifying the blocks that best represent respective pixels of the image.

The invention is best used with real images, such as produced by a video camera or as found in a photograph. Real images have inherent properties including edges, colour contrast, light effects producing gradual colour change, light reflection and the like. The human eye and brain manipulate this information and sometimes mask some of it. As is known, humans do not always perceive the image they are presented with. Using this property, when an image is compressed according to the invention, the eye and brain perceiving the image will mask some of the details of the image and extract only the important details. Hence, while in mathematical terms, the invention allows significant loss of information, when the resulting image is displayed, the human eye and brain interpreting the image correct for at least some of this loss and an intelligible interpretation of the image can be made.

Effectively, the invention provides an electronic emulation of the human eye in the functions of colour manipulation. The edge detector aspects of the invention emulate the feature extraction ability of the human eye and brain and when the human eye and brain are used to interpret an image resulting from the invention, intelligible information can be perceived.

BRIEF DESCRIPTION OF THE DRAWINGS

In drawings which illustrate embodiments of the invention,

FIG. 2 is a schematic representation of a frame of video information;

FIG. 3 is a representation of a set of sample numbers representing the frame of video information depicted in FIG. 2;

FIG. 8 is a table illustrating initial mapping weights of a mapping function according to the first embodiment of the invention.

DETAILED DESCRIPTION

Figure 1:
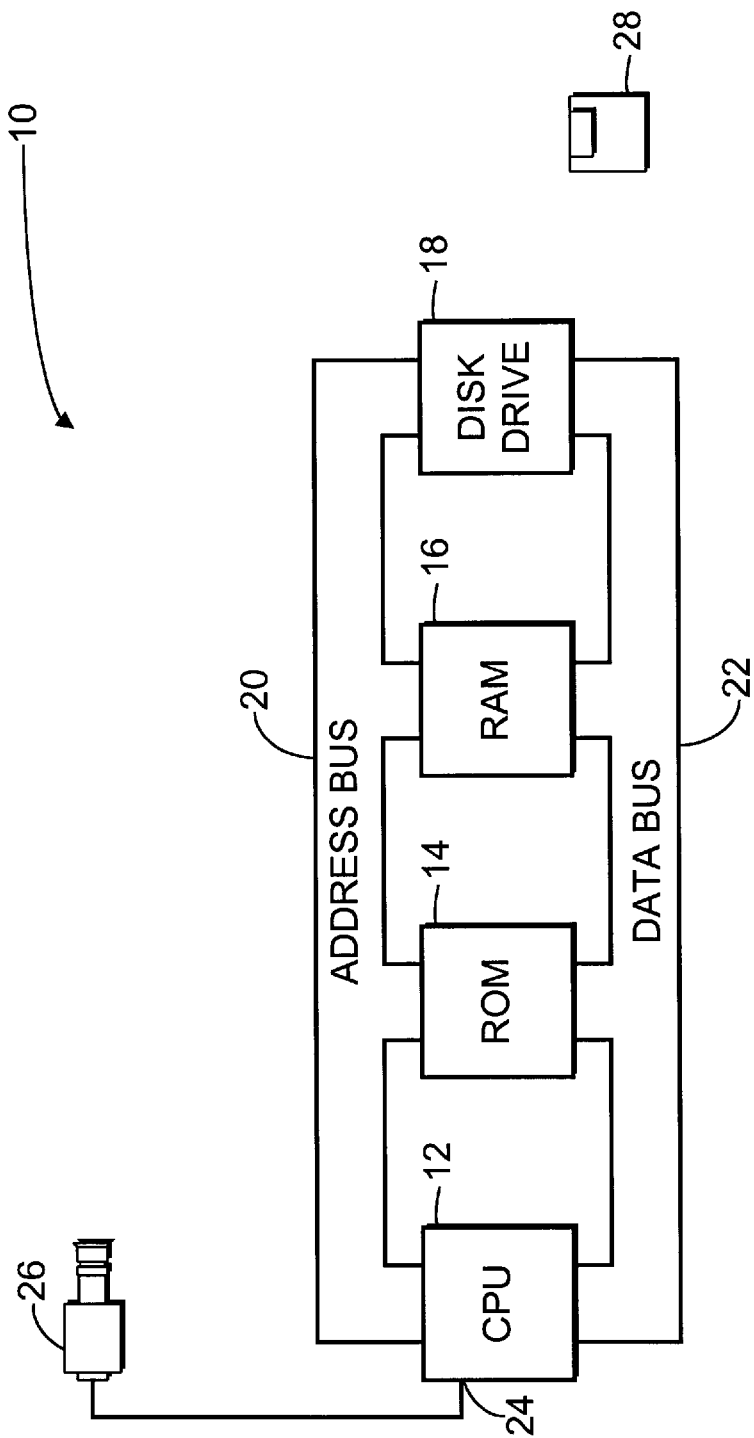
FIG. 1 is a block diagram of a computer circuit according to a first embodiment of the invention.

Referring to FIG. 1, an apparatus according to a first embodiment of the invention is shown generally at 10. The apparatus includes a computer circuit including a central processing unit (CPU) 12, a Read-Only-Memory (ROM) 14, a Random Access Memory (RAM) 16, and a disk drive 18, all connected to each other for inter-communication by address and data signal lines 20 and 22.

Figure 2:
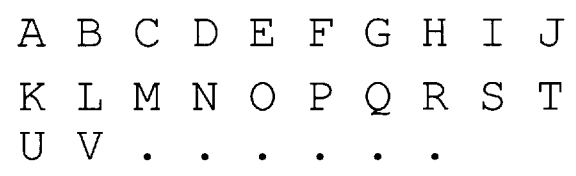
Figure 3:
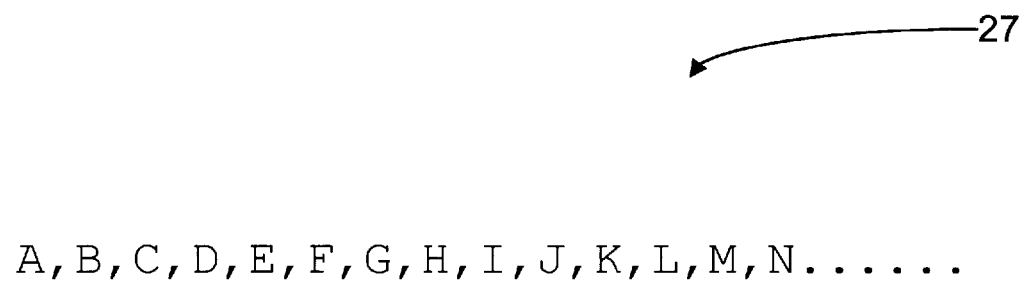

The CPU 12 has an input/output (I/O) port 24 to which is connected a colour video camera 26 operable to produce digital camera signals representing an image as a plurality of frames of the image, each frame being represented as a two dimensional array of picture elements (pixels) as seen in FIG. 2. In this embodiment, the camera digitizes each pixel with a resolution of 8 bits which provides 256 levels of colour representation for each pixel. Referring to FIGS. 2 and 3, the digital camera signals produced by the camera are in the form of a sequence of numbers (A,B,C,D, . . . ) representing the colours of pixels in successive left to right scan lines taken from the top to the bottom of the image frame as seen when looking at the image. One complete scan of the image is referred to as a frame. Hence, the camera produces sets of numbers (A,B,C,D, . . . ), each set representing successive frames of the image.

Referring back to FIG. 1, the disk drive 18 is operable to receive a disk 28 which is readable by the CPU 12. The disk 28 acts as a processor readable storage medium on which is stored a set of instructions operable to direct the CPU 12 to reduce the dynamic range of the set of numbers (27 in FIG. 3) representing the graphic image. This set of instructions includes compression instructions operable to direct the CPU 12 to logically partition the RAM 16 and to compress the set of numbers (27 in FIG. 3) from the video camera 26 representing the graphic image. The ROM 14 is configured with a set of system instructions to direct the CPU 12 to interact with the disk drive 18 to load the compression instructions from the disk 28 to the RAM 16 and then to execute the compression instructions from the RAM 16.

Figure 4:
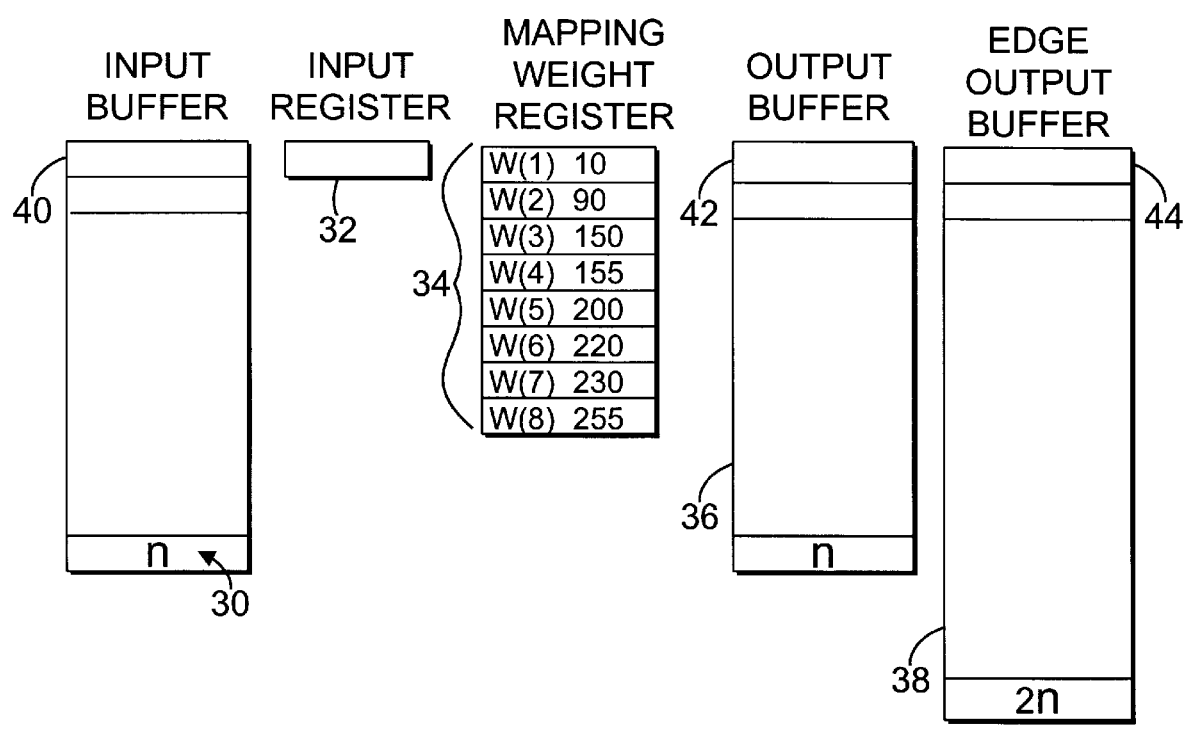
FIG. 4 is a schematic representation of various registers logically partitioned in a Random Access Memory according to the first embodiment of the invention.

Referring to FIG. 4, the compression instructions logically divide the RAM (16 in FIG. 3) to include an input buffer 30, an input register 32, a plurality of mapping weight registers 34, an output buffer 36, and an edge output buffer 38.

In this embodiment, the input buffer 30 includes n byte-wide input buffer memory registers 40, where n is equal to the number of pixels in an entire frame of video information. Effectively one input buffer register 40 is required for each pixel in a frame of video information and the entire input buffer 30 holds pixel colour data for an entire frame of video information. The input buffer 30 stores a sample set of sample numbers representing the graphic image.

The input register 32 is 8 bits wide and is used for receiving and temporarily storing a sample number from the input buffer 30.

In this embodiment, there are 8 mapping weight registers w1–w8, each being 8-bits wide. The mapping weight registers are operable to hold mapping weight values of a mapping function implemented by the compression instructions.

The output buffer 36 is similar to the input buffer 30 and has the same number of registers 42 are there are pixels in one frame of video. It has the same size as the input buffer 30.

In this embodiment, the edge output buffer 38 is similar to the output buffer 36 and has the same number of registers 44 as there are pixels in one frame of video. The number of registers in the edge output buffer 38 however, may be variable with each frame of video information. The edge output buffer 38 has the same number of pixels as there are pixels in one frame of video.

Figure 5:
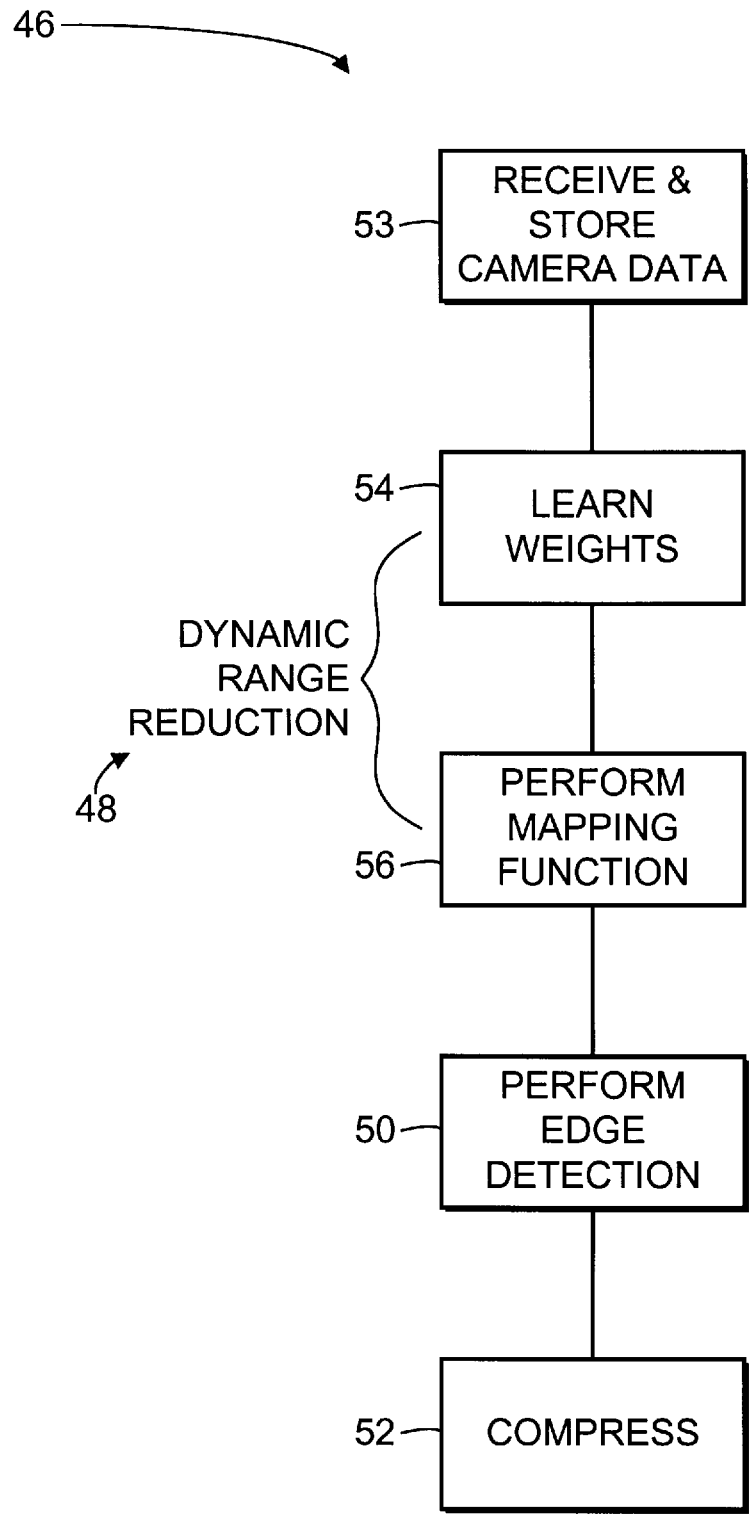
FIG. 5 is a flow chart of a compression set instructions according to the first embodiment of the invention.

Referring to FIG. 5, the compression instructions are shown generally at 46 and include subsets of instructions which include a dynamic range reduction instruction set shown generally at 48, an edge detection instruction set 50 and a conventional compression instruction set 52. The dynamic range reduction instruction set 48 itself, is operable to reduce the dynamic range of the set of numbers representing the frame of video information. The edge detection instruction set 50 and the compression instruction set 52 serve to compress the results of the dynamic range reduction set of instructions 48.

Dynamic Range Reduction

Figure 6:
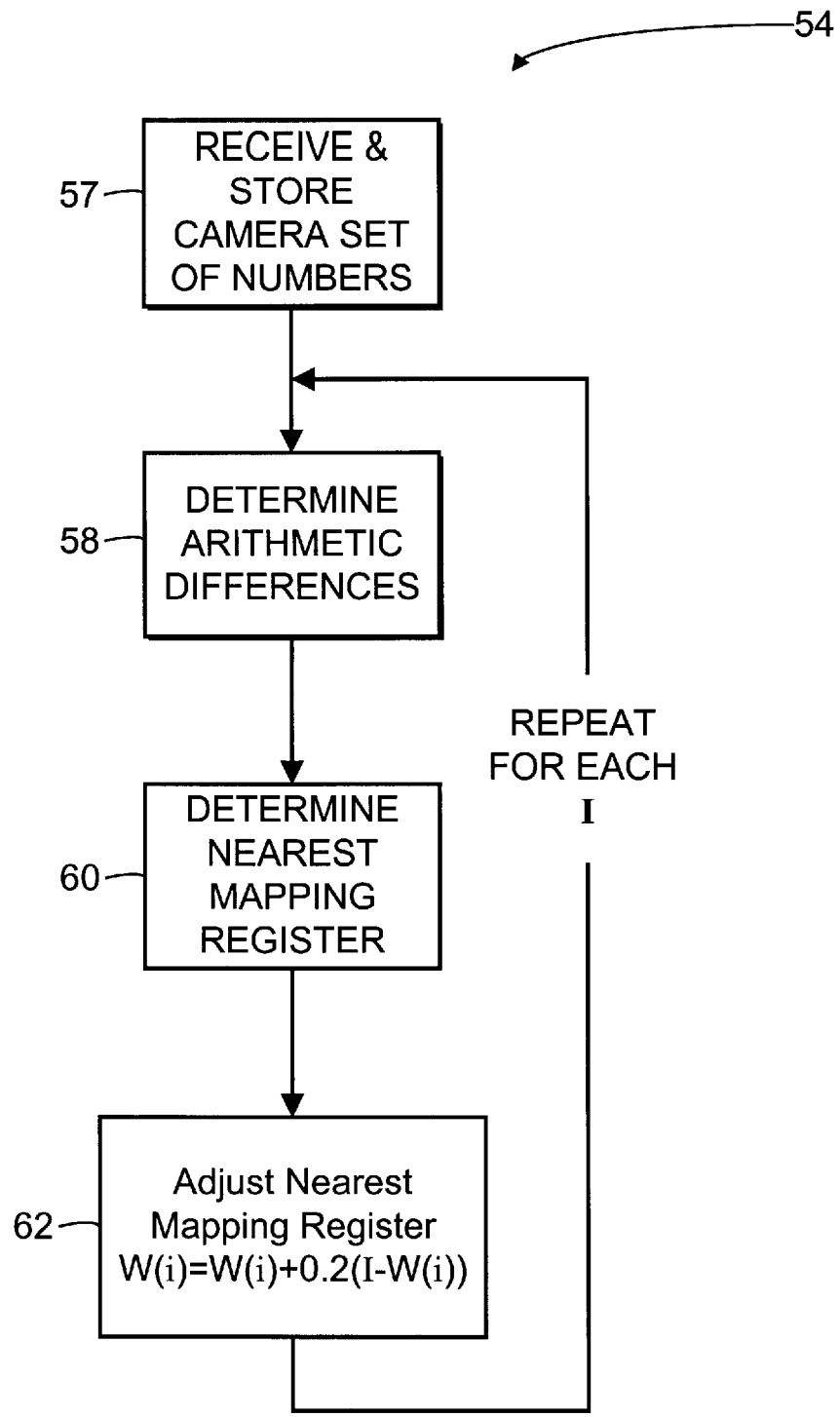
FIG. 6 is a flow chart of a learning set of instructions according to the first embodiment of the invention.
Figure 7:
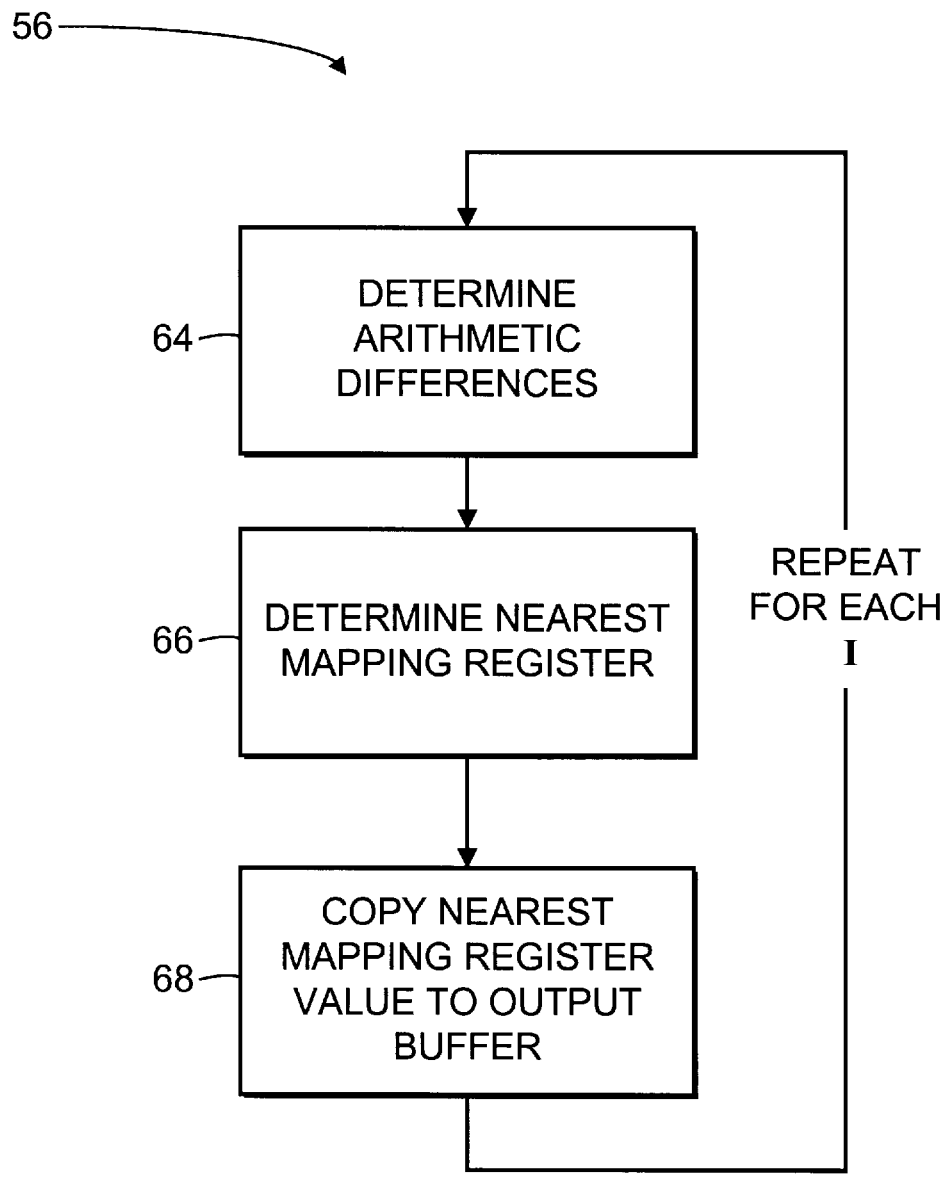
FIG. 7 is a flow chart depicting a mapping set of instructions according to the first embodiment of the invention.

The dynamic range reduction instruction set 48 includes a learning subset of instructions 54 and a mapping function subset of instructions 56, shown in FIGS. 6 and 7 respectively.

Learning Subset

Referring to FIG. 6, the learning subset of instructions 54 includes instructions 57 for receiving successive sets of numbers representing frames of video from the camera (26 in FIG. 1) and for storing these sets of numbers in the input buffer (30 in FIG. 4). In effect therefore, the camera acts to produce a sample set of sample numbers representing a representative sample of the image, where a frame is considered to be a representative sample of the image and the set of numbers produced by the camera is considered to be representative of the frame. Instruction set 57 also stores the set of numbers produced by the camera in successive registers of the input buffer 30 of FIG. 4.

The learning subset further includes instructions 58 for determining the arithmetic differences between the contents of the input register (32 in FIG. 4) and each of the mapping registers (w1–w8 in FIG. 4). Referring to FIG. 4, this is accomplished by copying the contents of the first register 40 in the input buffer 30 to the input register 32 and successively subtracting the contents of the input register 32 from the contents of each of the eight mapping weight registers w1–w8.

As initial mapping weight starting values, it is desirable to select values which are likely to represent the best eight colours to represent the graphic image. For example to represent a graphic image having an even colour component distribution, it might be desirable to represent the image with the colours red, orange, yellow, green, blue, indigo, violet, and purple and define these colours at the numerical values 0, 90, 150, 155, 200, 220, 230, 255 respectively, as shown in FIG. 8.

Using the above numbers therefore, assume the first entry in the input buffer is 80, representing an orange-red colour. This will be referred to as the current input value. After taking differences, a list of differences is produced, the list comprising the entries:

| | |
|---|---|
| w1 − I = d1 | 0 − 80 = −80 |
| w2 − I = d2 | 90 − 80 = 10 |
| w3 − I = d3 | 150 − 80 = 70 |
| w4 − I = d4 | 155 − 80 = 75 |

-continued

| | |
|---|---|
| w5 − I = d5 | 200 − 80 = 120 |
| w6 − I = d6 | 220 − 80 = 140 |
| w7 − I = d7 | 230 − 80 = 150 |
| w8 − I = d8 | 255 − 80 = 175 |

Referring back to FIG. 6, after determining the above arithmetic differences, the learning subset of instructions 54 directs the CPU to determine the mapping weight arithmetically nearest to the input value, as indicated at functional block 60. This is done by a simple comparison test comparing each difference value to each other and rejecting the larger number in each comparison. In the example above, the number 10 will clearly win the comparison, indicating that weight number w2, having the value 90, is the nearest to the input value of 80.

After having determined that w2 is the nearest weight, functional block 62 causes the value of w2, 90, to be increased or decreased in proportion to the least arithmetic difference. In this embodiment, this is accomplished using the following function:

$$wi'=wi+0.2(I-wi)$$

This function involves the computation of a weighting adjustment factor determined by multiplying the arithmetic difference (I−wi) between the input number (I) and the nearest mapping weight value (wi) by an adjustment value, which in this embodiment is 0.2. The weighting adjustment factor is then added (or subtracted if it is a negative number) to the nearest mapping weight. In other words, the nearest mapping weight is increased or decreased by 20% of the difference between the input number and the nearest mapping weight. Using the numbers presented thus far, $$i=2, wi=90 \text{ and } I=80:$$

$$wi'=90+0.2(80-90)$$

$$wi'=88$$

The new mapping value is 88. The contents of mapping weight register w2 are replaced with the value 88.

After having replaced the mapping weight for the first register in the input buffer (30 in FIG. 4), the contents of the input register (32 in FIG. 4) are replaced with successive samples from successive registers in the input buffer (30 in FIG. 4) and the above steps are repeated. The effect is that the above steps are repeated for a plurality of samples representative of the graphic image. By performing the above steps on each input value, the eight mapping weights are cumulatively adjusted such that they converge to respective values that will best represent the frame represented by the values stored in the input buffer (30 in FIG. 4).

For the purposes of this explanation assume that after all input buffer values have been used in the learning subset of instructions, the mapping weights have converged to the following values;

0, 32, 64, 95, 128, 160, 192, 224

These numbers represent the most statistically accurate representation of the frame of video information.

In effect therefore, the learning subset of instructions acts to determine, for each sample number, a corresponding nearest mapping weight from a plurality of mapping weights of a mapping function, and increases or decreases the corresponding nearest mapping weight in proportion to the arithmetic difference between the corresponding nearest mapping weight and the sample number.

Referring to FIG. 7, after the learning subset of instructions shown in FIG. 6 have been completed, the mapping function instruction set 56 is executed to perform a mapping function on each input value to produce and load into the output buffer (36 in FIG. 4) an output sequence of numbers.

Mapping Function Subset

The mapping function instructions include a functional block 64 which directs the CPU to again retrieve and load into the input register (32 in FIG. 4) the contents of the first register (40 in FIG. 4) and determine the arithmetic differences between the contents of the input register and the contents of the mapping registers (w1–w8 in FIG. 4) as before.

A further functional block 66 directs the CPU (12 in FIG. 1) to determine the mapping register (w1–w8 in FIG. 4) having contents arithmetically nearest the input value, as before.

After having determined which mapping register has the nearest value, a further functional block 68 directs the CPU (12 in FIG. 1) to copy the contents of the nearest mapping register to the first register (44 in FIG. 4) in the output buffer (38 in FIG. 4).

Using the numbers presented thus far, the first input value is under consideration. Its value is 80 and the contents of the mapping registers are as follows:

w1=0, w2=32, w3=64, w4=95, w5=128, w6=160, w7=192, w8=224

Referring to FIG. 4, in the above example, the nearest mapping weight to 80 has the value 95, hence 95 will be copied into the first register 44 of the output buffer 36. In this manner, successive registers of the output buffer 36 are loaded with the nearest mapping value w1–w8 to respective corresponding input values stored in the input buffer 30. The output buffer 36 therefore only contains numbers equal to the mapping weight values w1–w8, hence only mapping values, of which there are only eight, are used to represent pixel colours. As the original representation of the image by the camera (26 in FIG. 1) represented the colour of each pixel with a number between 0 and 255 and each register of the output buffer 36 represents the colour of a pixel with one of eight numbers, the dynamic range of the input numbers representing the image is considerably reduced. The output buffer 36 thus contains a reduced set of numbers representing the graphic image, the numbers being stored in successive registers in the output buffer 36.

In effect, the mapping function set of instructions acts to apply each successive input number to a mapping function to produce a corresponding output number which is generally equal to the corresponding nearest mapping weight.

Edge Detection

Referring back to FIG. 5, upon completion of the dynamic range reduction instruction set 48, the edge detection instruction set 50 directs the CPU to perform an edge detecting function on the reduced set of numbers stored in the output buffer (36 in FIG. 4) to produce and store in the edge output buffer (38 in FIG. 4) an edge representative series of numbers representing changes and locations of changes in the reduced set of numbers stored in the output buffer (36 in FIG. 4).

Figure 9:
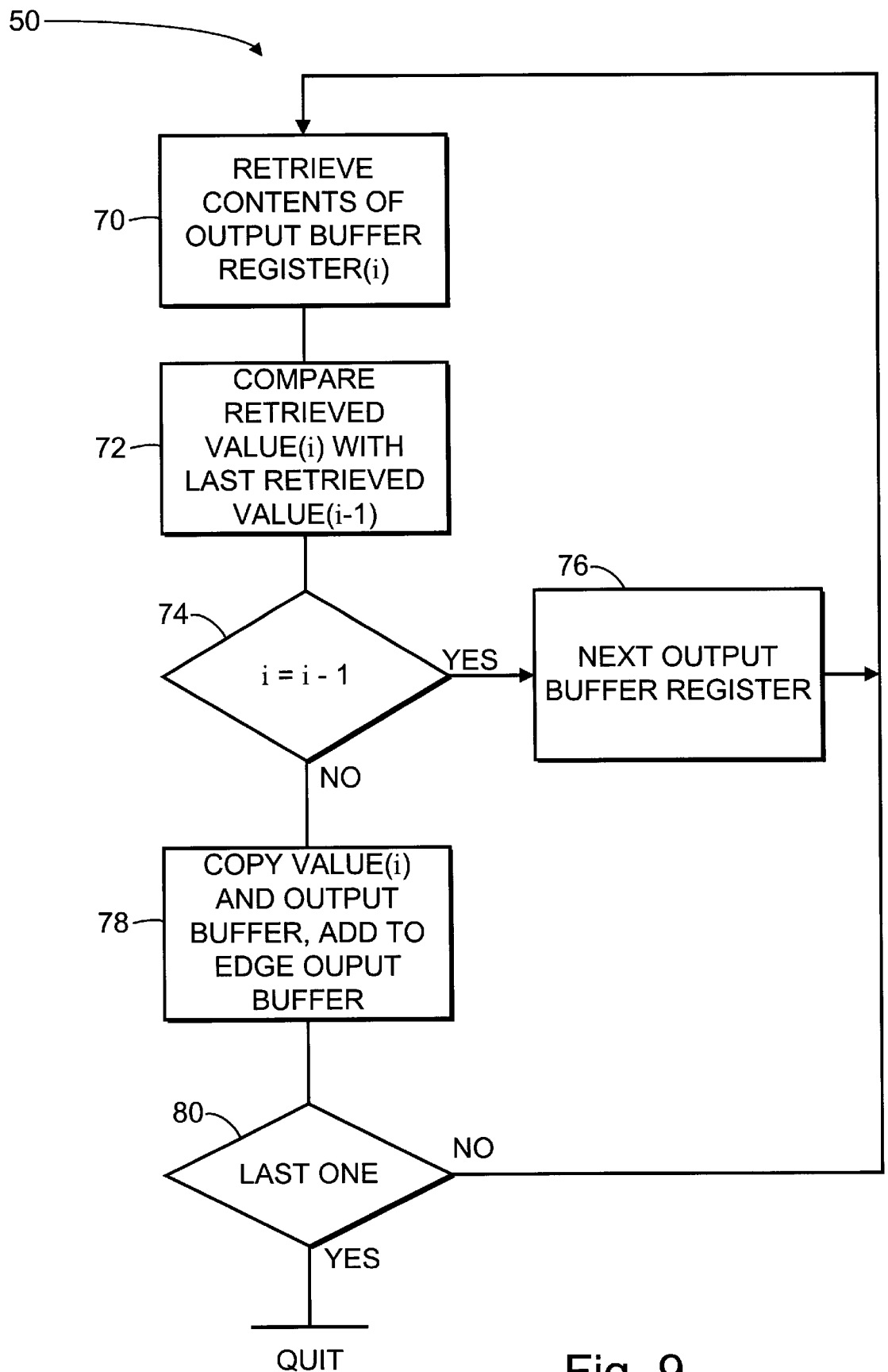
FIG. 9 is a flow chart depicting an edge detection set of instructions according to the first embodiment of the invention.

Referring to FIG. 9, the edge detection instruction set is shown generally at 50. This instruction set includes functional blocks 70 and 72 which direct the CPU (12 in FIG. 1) to retrieve the contents of successive registers of the output buffer (36 in FIG. 4) and compare each with the one previously retrieved. A further functional block 74 directs the CPU (12 in FIG. 1) to functional block 76 if the contents are equal, and to functional block 78 if the contents are unequal.

Functional block 76 causes to CPU (12 in FIG. 1) to consider the contents of the next register in the output buffer (36 in FIG. 4) and functional blocks 70 and 72 are repeated to repeat the steps of retrieving and comparing.

Functional block 78 causes the CPU (12 in FIG. 1) to copy the current value and the output buffer address of the current value to the edge output buffer (38 in FIG. 4).

The final step of the edge detector instruction set is functional block 80 which directs the CPU (12 in FIG. 1) to determine whether or not the current value is from the last register in the output buffer (36 in FIG. 4) and if so, ending the edge detection set of instructions 50. If not, the CPU (12 in FIG. 1) is directed to functional blocks 70 and 72 again. In this manner, number pairs representing the colour value and the location of the colour value change in the output buffer (36 in FIG. 4) are used to represent the image. Referring to FIGS. 2, 3, and 4, in effect, the differences in colour along the scan lines are stored in the edge output buffer 38, resulting in representation of the image using less data than presented by the video camera (26 in FIG. 1). It will be appreciated that if the graphic image contains a large number of colours or the scene is complex, the edge output buffer 38 will have more entries than if the graphic image has only a few colours or if the scene is simple.

In effect, after the completion of the edge detection set of instructions 50, the set of numbers representing the graphic image has been compressed by first producing a reduced set of numbers representing the graphical image, this reduced set of numbers having a lesser dynamic range than the initial set of numbers, and passing this reduced set of numbers through an edge detector to produce an edge representative series of numbers representing changes and locations of changes in the reduced set of numbers.

Compression

Referring back to FIG. 5, after completing the edge detection set of instructions 50, the edge output buffer will be loaded with data representing the image frame. The compress instruction set 52 then directs the CPU (12 in FIG. 1) to compress the edge output buffer contents using conventional compression methods such as the MPEG or JPEG compression algorithms for motion pictures and still pictures respectively. The use of the compress instruction set is optional. If the compress instruction set is used, it reads the edge output buffer data and places compressed values in a compress buffer (not shown) to represent the edge output buffer data. The compressed values effectively represent a compressed form of the graphic image which may be stored using less memory than would otherwise be required to represent the graphic data produced by the video camera, or the compressed values may be used to transmit the image frame over a communications medium.

Using the above apparatus, it is possible to transmit an image in real time over a low bit-rate transmission channel. The simplicity of the procedure involved allows the process to be completed within time limits which permit successive frames of video information to be transmitted in real time.

Reconstruction of the image on a display, involves decompressing the compressed data to reproduce the contents of the edge output buffer. This step is only necessary if the compression set of instructions was used before the data was stored of transmitted.

Decompression reproduces the contents of the edge output buffer. The inverse of the edge detector function is performed on the contents of the edge output buffer to reconstruct the contents of the output buffer, which can be used to drive a display capable of assigning colours to individual pixels. Since the output buffer data contains only eight different numbers, only eight colours will be used to represent the graphic image on the display. However, it is a property of the human eye and brain cooperation that only eight colours can be perceived at once and even though the displayed image will have colours which change in a non-gradual way, the cooperation between the eye and the brain will interpret the image as coherent and understandable. For example, if a person is presented with an image of a rainbow where the colours are not gradually changing, the person will still know the image is that of a rainbow.

In this embodiment, it is desirable to perform the steps shown in FIG. 5 on a frame-by-frame basis for an image presented in real time. This causes the weights (w1–w8 in FIG. 4) to be learned independently for each frame and thus each frame is represented by a set of weights which is the best statistical representation of that frame. Each frame has therefore associated with it a corresponding set of weights which best represents the frame. Hence, as the pixels within a frame change colour to represent the image, so do the weights. Hence when the image is displayed each frame is represented by the eight best colours which depict it. Since the eye is capable of only perceiving eight colours at once, the brain and eye will experience little fatigue and will require little processing time for interpretation of the image.

Alternatives

Referring to FIG. 5, in a first alternative embodiment, the learning subset of instructions 54 is performed at periodic intervals, perhaps each second. This would be once every 60 frames if the frames are provided at 60 frames per second. In this case, the instruction sets of mapping, edge detection and compression 56, 50 and 52 would be repeatedly performed with the learning instruction set 54 being executed once each second. A separate timer (not shown) may be used to interrupt the CPU (12 in FIG. 1) at one second intervals to cause the learning instruction set to be executed. The need to perform the learning set of instructions 54 depends upon how fast the image is changing. The faster or more often the image changes, the more often the learning set of instructions should be performed to maintain the best statistical representation of the image.

Still referring to FIG. 5, in a second alternative embodiment, the learning subset of instructions 54 may be performed asynchronously, such as upon scene changes. This is possible by adding after the compress set of instructions 50 in FIG. 5, the steps of comparing successive frame pixel data, accumulating a difference value and executing the learning subset of instructions 54 only when the accumulated difference value exceeds a preset threshold value. Otherwise, the mapping, edge detection and compression instruction sets 56, 50 and 52 would be repeated. In this case, the higher the threshold value, the more changes in the image will be tolerated before the learning subset is executed.

It will be appreciated that the invention disclosed herein has more general application in reducing the dynamic range of numbers representing a physical quantity. For example, the invention may be used to compress sound information, where the input buffer (30 in FIG. 4) is loaded with successive samples of audio data representing instantaneous amplitudes of an audio waveform. A number of samples are taken, perhaps a few seconds of audio samples, and stored in the input buffer (30 in FIG. 4). The learning subset of instructions shown in FIG. 6, is then executed to determine the best mapping weights and the samples are processed according to the mapping function 56 shown in FIG. 7, to assign the best mapping weight to each sample, as an output sample. Such samples are stored in the output buffer (36 in FIG. 4). In this manner the dynamic range of audio data can be reduced. The effect would be similar to re-quantizing the audio data with unequal and periodically changing quantization ranges.

It will be appreciated that more than eight mapping weights may be used where greater resolution in the ultimate representation of the physical quantity being represented is desired. For example eight mapping weights have been found useful for representation of graphic image data from a video camera. For an audio system however, where 16-bit samples are taken, for example, it may be desirable to use more than 8 mapping weights to obtain better resolution in the ultimate representation.

While specific embodiments of the invention have been described and illustrated, such embodiments should be considered illustrative of the invention only and not as limiting the invention as construed in accordance with the accompanying claims.

What is claimed is:

1. A method of reducing the dynamic range of input numbers representing a physical quantity, the method comprising the steps of:
   a) producing a sample set of sample numbers representing a representative sample of said physical quantity;
   b) for each sample number, determining a corresponding nearest mapping weight from a plurality of mapping weights of a mapping function, and increasing or decreasing said corresponding nearest mapping weight in proportion to the arithmetic difference between said corresponding nearest mapping weight and said each sample number;
   c) applying each successive input number, to said mapping function to produce a corresponding output number.

2. A method as claimed in claim 1 wherein the step of applying includes the step of producing a corresponding output number generally equal to the corresponding nearest mapping weight.

3. A method as claimed in claim 1 wherein the step of determining includes finding the arithmetic difference between said each sample number and each mapping weight of said mapping function and selecting as said corresponding nearest mapping weight a mapping weight which is associated with the least arithmetic difference.

4. A method as claimed in claim 3 wherein the step of increasing or decreasing includes decreasing said corresponding nearest mapping weight when said each sample number is less than said corresponding nearest mapping weight and increasing said corresponding nearest mapping weight when said each sample number is greater than said corresponding nearest mapping weight.

5. A method as claimed in claim 4 wherein the step of increasing or decreasing includes the step of producing a weighting adjustment factor by multiplying the arithmetic difference between said each sample number and said corresponding nearest mapping weight by an adjustment value.

6. A method as claimed in claim 5 wherein the step of increasing or decreasing includes the step of adding or subtracting said adjustment factor from said corresponding nearest mapping weight.

7. A method as claimed in claim 1 wherein the step of applying each successive input number to said mapping function includes the step of finding the arithmetic difference between said each successive input number and each mapping weight of said mapping function and selecting as said corresponding nearest mapping weight a mapping weight which is associated with the least arithmetic difference.

8. A method as claimed in claim 1 wherein the step of producing includes the step of producing a series of numbers representing the colours of pixels in successive scanlines of a colour image.

9. A method as claimed in claim 1 wherein the steps of determining and increasing or decreasing are performed periodically.

10. A method as claimed in claim 1 wherein the steps of determining and increasing or decreasing are performed asynchronously.

11. A method as claimed in claim 1 wherein the steps of determining and increasing or decreasing are performed when the arithmetic difference between successive input numbers exceeds a pre-defined difference value.

12. A method of compressing a set of numbers representing a graphic image, said set of numbers having an initial dynamic range, the method including the steps of:
   a) producing a reduced set of numbers representing said graphical image, said reduced set of numbers having a lesser dynamic range than said initial dynamic range; and
   b) passing said reduced set of numbers through an edge detector to produce an edge representative series of numbers representing changes and locations of changes in said reduced set of numbers.

13. A method as claimed in claim 12 wherein the step of producing a reduced set of numbers representing said graphical image includes the steps of:
   a) for each number in said set of numbers, determining a corresponding nearest mapping weight from a plurality of mapping weights of a mapping function, and increasing or decreasing said corresponding nearest mapping weight in proportion to the arithmetic difference between said corresponding nearest mapping weight and said each number; and
   b) applying each successive number of said initial set of numbers, to said mapping function to produce corresponding output numbers, said corresponding output numbers acting as said reduced set of numbers representing said graphic image.

14. A method as claimed in claim 13 wherein the step of applying includes producing corresponding output numbers generally equal to the corresponding nearest mapping weight.

15. A method as claimed in claim 13 wherein the step of determining includes finding the arithmetic difference between said each sample number and each mapping weight of said mapping function and selecting as said corresponding nearest mapping weight a mapping weight which is associated with the least arithmetic difference.

16. A method as claimed in claim 15 wherein the step of increasing or decreasing includes decreasing said corresponding nearest mapping weight when said each sample number is less than said corresponding nearest mapping weight and increasing said corresponding nearest mapping weight when said each sample number is greater than said corresponding nearest mapping weight.

17. A method as claimed in claim 16 wherein the step of increasing or decreasing includes the step of producing a weighting adjustment factor by multiplying the arithmetic difference between said each sample number and said corresponding nearest mapping weight by an adjustment value.

18. A method as claimed in claim 17 wherein the step of increasing or decreasing includes the step of arithmetically adding or subtracting said adjustment factor from said corresponding nearest mapping weight.

19. A method as claimed in claim 13 wherein the step of applying each successive input number to said mapping function includes the step of finding the arithmetic difference between said each successive input number and each mapping weight of said mapping function and selecting as said corresponding nearest mapping weight a mapping weight which is associated with the least arithmetic difference.

20. A method as claimed in claim 13 wherein the steps of determining and increasing or decreasing are performed periodically.

21. A method as claimed in claim 13 wherein the steps of determining and increasing or decreasing are performed asynchronously.

22. A method as claimed in claim 13 wherein the steps of determining and increasing or decreasing are performed when the arithmetic difference between successive input numbers exceeds a pre-defined difference value.

23. A method as claimed in claim 12 further including the step of compressing said edge representative series of numbers.

24. A processor-readable storage medium having stored thereon instructions operable to direct a processor to reduce the dynamic range of input numbers representing a physical quantity by:
   a) producing a sample set of sample numbers representing a representative sample of said physical quantity;
   b) for each sample number, determining a corresponding nearest mapping weight from a plurality of mapping weights of a mapping function, and increasing or decreasing said corresponding nearest mapping weight in proportion to the arithmetic difference between said corresponding nearest mapping weight and said each sample number;
   c) applying each successive input number, to said mapping function to produce a corresponding output number.

25. A processor-readable storage medium as claimed in claim 24 further including instructions operable to direct the processor to produce a corresponding output number generally equal to the corresponding nearest mapping weight.

26. A processor-readable storage medium as claimed in claim 24 further including instructions operable to direct the processor to find the arithmetic difference between said each sample number and each mapping weight of said mapping function and select as said corresponding nearest mapping weight a mapping weight which is associated with the least arithmetic difference.

27. A processor-readable storage medium as claimed in claim 26 further including instructions operable to direct the processor to decrease said corresponding nearest mapping weight when said each sample number is less than said corresponding nearest mapping weight and increase said corresponding nearest mapping weight when said each sample number is greater than said corresponding nearest mapping weight.

28. A processor-readable storage medium as claimed in claim 27 further including instructions operable to direct the processor to produce a weighting adjustment factor by multiplying the arithmetic difference between said each sample number and said corresponding nearest mapping weight by an adjustment value.

29. A processor-readable storage medium as claimed in claim 28 further including instructions operable to direct the processor to arithmetically add or subtract said adjustment factor from said corresponding nearest mapping weight.

30. A processor-readable storage medium as claimed in claim 24 further including instructions operable to direct the processor to find the arithmetic difference between said each successive input number and each mapping weight of said mapping function and select as said corresponding nearest mapping weight a mapping weight which is associated with the least arithmetic difference.

31. A processor-readable storage medium as claimed in claim 24 further including instructions operable to direct the processor to produce a series of numbers representing the colours of pixels in successive scanlines of a colour image.

32. A processor-readable storage medium as claimed in claim 24 further including instructions operable to direct the processor to periodically increase or decrease said mapping weights.

33. A processor-readable storage medium as claimed in claim 24 further including instructions operable to direct the processor to asynchronously increase or decrease said mapping weights.

34. A processor-readable storage medium as claimed in claim 24 further including instructions operable to direct the processor to increase or decrease said mapping weights when the arithmetic difference between successive input numbers exceeds a pre-defined difference value.

35. A processor-readable storage medium having stored thereon instructions operable to direct a processor to compress an initial set of numbers representing a graphic image, by:
   a) producing a reduced set of numbers representing said graphical image, said reduced set of numbers having a lesser dynamic range than said initial set of numbers; and
   b) performing an edge detector function on said reduced set of numbers to produce an edge representative series of numbers representing changes and locations of changes in said reduced set of numbers.

36. A processor-readable storage medium as claimed in claim 35 further including instructions operable to direct the processor to:
   a) for each number in said initial set of numbers, determine a corresponding nearest mapping weight from a plurality of mapping weights of a mapping function, and increase or decrease said corresponding nearest mapping weight in proportion to the arithmetic difference between said corresponding nearest mapping weight and said each number; and
   b) apply each successive number of said initial set of numbers, to said mapping function to produce corresponding output numbers, said corresponding output numbers acting as said reduced set numbers representing said graphic image.

37. A processor-readable storage medium as claimed in claim 36 further including instructions operable to direct the processor to produce corresponding output numbers generally equal to the corresponding nearest mapping weight.

38. A processor-readable storage medium as claimed in claim 36 further including instructions operable to direct the processor to find the arithmetic difference between said each sample number and each mapping weight of said mapping function and select as said corresponding nearest mapping weight a mapping weight which is associated with the least arithmetic difference.

39. A processor-readable storage medium as claimed in claim 38 further including instructions operable to direct the processor to decrease said corresponding nearest mapping weight when said each sample number is less than said corresponding nearest mapping weight and increase said corresponding nearest mapping weight when said each sample number is greater than said corresponding nearest mapping weight.

40. A processor-readable storage medium as claimed in claim 39 further including instructions operable to direct the processor to produce a weighting adjustment factor by multiplying the arithmetic difference between said each sample number and said corresponding nearest mapping weight by an adjustment value.

41. A processor-readable storage medium as claimed in claim 40 further including instructions operable to direct the processor to arithmetically add or subtract said adjustment factor from said corresponding nearest mapping weight.

42. A processor-readable storage medium as claimed in claim 36 further including instructions operable to direct the processor to find the arithmetic difference between said each successive input number and each mapping weight of said mapping function and select as said corresponding nearest mapping weight a mapping weight which is associated with the least arithmetic difference.

43. A processor-readable storage medium as claimed in claim 36 further including instructions operable to direct the processor to periodically increase or decrease said mapping weights.

44. A processor-readable storage medium as claimed in claim 36 further including instructions operable to direct the processor to asynchronously increase or decrease said mapping weights.

45. A processor-readable storage medium as claimed in claim 36 further including instructions operable to direct the processor to increase or decrease said mapping weights when the arithmetic difference between successive input numbers exceeds a pre-defined difference value.

46. A processor-readable storage medium as claimed in claim 36 further including instructions operable to direct the processor to compress said edge representative series of numbers.

47. An apparatus for reducing the dynamic range of input numbers representing a physical quantity, the apparatus comprising:
   a) an input register for successively receiving and storing said input numbers;
   b) a plurality of mapping registers for storing mapping weights of a mapping function;
   c) a processor in communication with said input memory and said plurality of mapping registers;
   d) a processor-readable medium on which is stored instructions operable to direct said processor to:
      i) determine the arithmetic differences between the contents of said input register and said mapping registers;
      ii) determine a nearest mapping register associated with the least arithmetic difference;
      iii) increase or decrease the contents of said nearest mapping register in proportion to said least arithmetic difference;
      iv) replace the contents of the input register with successive sample numbers and repeat the above steps for a plurality of sample numbers representative of said physical quantity;
      v) perform said mapping function on each of said input numbers of said sample set to produce corresponding output numbers.

48. An apparatus as claimed in claim 47 wherein said processor readable medium further includes instructions operable to direct the processor to implement said mapping function, by determining the arithmetic differences between the contents of the input register and the contents of said mapping registers, determining a nearest mapping register having contents arithmetically nearest said input number and producing as said corresponding output number the contents of said nearest mapping register.

49. An apparatus as claimed in claim 47 wherein said processor-readable medium includes a read-only-memory (ROM).

50. An apparatus as claimed in claim 47 wherein said processor-readable memory includes a processor-writable disk.

51. An apparatus for compressing an initial set of numbers representing a graphic image, said initial set of numbers having an initial dynamic range, the apparatus including:
   a) an input register for receiving and storing a sample number from a sample set of sample numbers representing said graphic image;
   b) a plurality of registers for storing mapping weights of a mapping function;
   c) a processor in communication with said input memory and said plurality of mapping registers;
   d) a processor-readable medium on which is stored instructions operable to direct said processor to:
   i) produce a reduced set of numbers representing said graphical image, by:
      1) determining the arithmetic differences between the contents of said input register and said mapping registers;
      2) determining a nearest mapping register is associated with the least arithmetic difference;
      3) increasing or decreasing the contents of said nearest mapping register in proportion to said least arithmetic difference;
      4) replacing the contents of the input register with successive sample numbers and repeating the above steps for a plurality of samples representative of said physical quantity;
      5) successively performing said mapping function on each of said input numbers to produce a sequence of corresponding output numbers, said corresponding output numbers acting as said reduced set of numbers; and
   ii) to produce an edge representative series of numbers representing changes and locations of changes in said reduced set of numbers by:
      1) determining the arithmetic differences between successive output numbers and, when a difference is non-zero, producing a number pair including said output number and a number representing the location of said output number in said output number sequence.

* * * * *